(12) United States Patent
Fujita et al.

(10) Patent No.: US 7,405,584 B2
(45) Date of Patent: Jul. 29, 2008

(54) PROBER AND PROBE CONTACT METHOD

(75) Inventors: Taichi Fujita, Tokyo (JP); Takahiro Hokida, Tokyo (JP); Tetsuo Hata, Tokyo (JP); Satoshi Moriyama, Tokyo (JP); Yoshiyuki Yokoyama, Tokyo (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 0 days.

(21) Appl. No.: 11/744,192

(22) Filed: May 3, 2007

(65) Prior Publication Data
US 2007/0268033 A1 Nov. 22, 2007

(30) Foreign Application Priority Data
May 16, 2006 (JP) ............... 2006-136133

(51) Int. Cl.
*G01R 31/02* (2006.01)
(52) U.S. Cl. ...................... 324/758; 324/761
(58) Field of Classification Search ............ None
See application file for complete search history.

(56) References Cited

U.S. PATENT DOCUMENTS

| | | | | |
|---|---|---|---|---|
| 6,111,421 | A * | 8/2000 | Takahashi et al. | ......... 324/758 |
| 6,124,725 | A * | 9/2000 | Sato | ......... 324/765 |
| 7,221,178 | B2 * | 5/2007 | Takahama | ......... 324/758 |
| 2007/0052939 | A1 * | 3/2007 | Ishii et al. | ......... 355/53 |
| 2008/0018352 | A1 * | 1/2008 | Chiba et al. | ......... 324/758 |

FOREIGN PATENT DOCUMENTS

| JP | 2001-210683 | 8/2001 |
|---|---|---|
| JP | 2004-39752 | 2/2004 |

OTHER PUBLICATIONS

Patent Abstracts of Japan, Publication No. 2001-210683, Published on Aug. 3, 2001, in the name of Chiba.
Patent Abstracts of Japan, Publication No. 2004-039752, Published on Feb. 5, 2004, in the name of Houkida, et al.

* cited by examiner

*Primary Examiner*—Ha Nguyen
*Assistant Examiner*—Richard Isla-Rodas
(74) *Attorney, Agent, or Firm*—Christie, Parker & Hale, LLP

(57) ABSTRACT

A prober that has improved positional precision of probing without reducing throughput is disclosed. The prober comprises a probe card having a probe, a wafer stage, a stage temperature adjustment mechanism, a wafer stage movement mechanism, a movement control section, and an alignment mechanism that detects the relative position between an electrode and the probe, wherein the movement control section controls the movement mechanism so as to cause the electrode to come into contact with the probe based on the detected relative position, and the prober further comprises a plurality of temperature sensors that detect the temperatures of a plurality of portions of the prober including the wafer stage and a predicted change amount calculation section that calculates the amount of change in relative position between the electrode and the probe based on a prediction model that uses at least part of the temperatures of the plurality of portions and the temperature difference between the wafer stage and the other sections as a variable.

6 Claims, 6 Drawing Sheets

PROBER AND PROBE CONTACT METHOD

BACKGROUND OF THE INVENTION

The present invention relates to a prober and a probe contact method for connecting an electrode of a die to a tester in order to conduct an electrical inspection of a plurality of semiconductor chips (dies) formed on a semiconductor wafer.

In a semiconductor manufacturing process, a plurality of chips (dies) each having a semiconductor device are formed by subjecting a thin, circular-disk-shaped semiconductor wafer to various processes. After the electrical characteristic of each chip is inspected and the chips are separated with a dicer, each chip is fixed to a lead frame, etc. and assembled. The above-mentioned inspection of the electrical characteristic is conducted using a prober and a tester. The prober fixes a wafer to a stage and causes probes to come into contact with the electrode pads of each chip. The tester supplies power and various test signals from a terminal to be connected to the probe and confirms whether the operation is normal by analyzing the signal output to the electrode of the chip with the tester.

The semiconductor device is used for many purposes and used in a wide temperature range. Because of this, when inspection of a semiconductor device is conducted, it is necessary to conduct the inspection, for example, at room temperature (normal temperature of a room), at a high temperature, such as 200° C., and at a low temperature, such as −55° C., and the prober is required to be capable of conducting inspection in such environments. In order to cope with this, for example, a wafer temperature adjustment mechanism, such as a heater mechanism, chiller mechanism, heat pump mechanism, etc., which changes the temperature of the surface of a wafer stage, is provided under the wafer surface mount of a wafer stage that holds a wafer in a prober and the wafer held on the wafer stage is heated or cooled.

FIG. 1 is a diagram showing a general configuration of a wafer test system comprising a prober having a wafer temperature adjustment mechanism. As shown schematically, a prober 10 has a base 11, a movement base 12 provided thereon, a Y axis movement base 13, an X axis movement base 14, a Z axis movement section 15, a Z axis movement base 16, a θ rotation section 17, a wafer stage 18, a needle positioning camera 19 for detecting the position of a probe, supports 20 and 21, a head stage 22, a wafer alignment camera 23 supported by a support (not shown), a card holder 24 provided on the head stage 22, a probe card 25 to be attached to the card holder 24, and a stage movement control section 27. The probe card 25 is provided with a probe 26 of a cantilever system. The movement base 12, the Y axis movement base 13, the X axis movement base 14, the Z axis movement section 15, the Z axis movement base 16, and the θ rotation section 17 constitute a movement/rotation mechanism that moves and rotates the wafer stage 18 in the directions of the three axes and around the Z axis, which is controlled by the stage movement control section 27. Since the movement/rotation mechanism is widely known, its explanation is omitted here. The probe card 25 has the probe 26 arranged in accordance with the arrangement of the electrodes of a device to be inspected and is exchanged in accordance with a device to be inspected.

In the wafer stage 18, a heater/cooling liquid path 28 for raising or reducing the temperature of the wafer stage 18 is provided. A temperature control section 29 controls the power to be supplied to the heater of the heater/cooling liquid path 28 and the temperature of the cooling liquid to be circulated through the cooling liquid path. Due to this, it is possible to adjust the wafer stage 18 to a desired temperature between high and low temperatures and in accordance with this, it is possible to inspect by adjusting a wafer W held by the wafer stage 18 to a desired temperature. The temperature control section 29 controls the temperature based on the temperature detected by a temperature sensor (not shown), provided near the surface of the wafer stage 11.

A tester 30 has a tester main body 31 and a contact ring 32 provided to the tester main body 31. The probe card 25 is provided with a terminal to be connected to each probe and the contact ring 32 has a spring probe arranged so as to come into contact with the terminal. The tester main body 31 is held by a support mechanism (not shown), with respect to the prober 10.

When inspection is conducted, the Z axis movement base 16 is moved so that the needle positioning camera 19 is located under the probe 26 and the needle positioning camera 19 detects the front end position of the probe 26. The front end position of the probe 26 must be detected whenever the probe card is exchanged with another and this is also done appropriately each time a predetermined number of chips are measured, even if the probe card is not exchanged. Next, in a state in which the wafer W to be inspected is fixed to the wafer stage 18, the Z axis movement base 16 is moved so that the wafer W is located under the wafer alignment camera 23 and the position of the electrode pad of the semiconductor chip on the wafer W is detected. It is not necessary to detect all of the positions of the electrode pads of one chip, but it is required to detect the positions of some of the electrode pads. In addition, it is not necessary to detect the electrode pads of all of the chips on the wafer W, but the positions of the electrode pads of some chips are detected.

FIG. 2 is a diagram explaining the operation of making the electrode pad come into contact with the probe 26. After the position of the probe 26 and the position of the wafer W are detected, the wafer stage 18 is rotated by the θ rotation section 17 so that the direction of arrangement of electrode pads of the chip coincides with the direction of the arrangement of the probes 26. Then, after moving the wafer stage 18 so that the electrode pad of the chip to be inspected of the wafer W is situated under the probe 26, the wafer stage 18 is lifted and the electrode pad comes into contact with the probe 26.

FIG. 3A shows an arrangement example of electrodes 42 on a semiconductor chip (die) 41 formed on the wafer W and FIG. 3B shows an arrangement example of the probes 26. The probes 26 are arranged in accordance with the arrangement of the electrodes 42. In recent years, a multi-probing process, which inspects a plurality of dies simultaneously, has been used in order to improve throughput and the number of probes 26 is equal to the number of electrodes of one die multiplied by the number of dies to be inspected simultaneously.

Accompanying the trend of reduction in size and increase in the level of integration, there is a trend for electrodes to become smaller and smaller, and an electrode about the size of 30×30 μm has been made recently. In order to cope with this, it is necessary to improve the positional precision of the probe 26 and further, it is necessary to improve alignment.

When the wafer W is inspected at a high or low temperature, or when the wafer W is inspected at room temperature after inspection at a high or low temperature is finished, the temperature control section 29 controls the wafer stage 18 so that it reaches a desired inspection temperature after the wafer W is fixed to thereto. When the temperature of the wafer stage 18 reaches the desired range of inspection temperatures, the temperature of the wafer W is assumed to be within the range of desired inspection temperatures, and the interrelation (relative position) between the front end position of the probe 26 and the electrode position of the die of the wafer W is detected by means of alignment, and after the electrode of the die is moved to immediately under the probe 26 based on the detected relative position, it is raised and comes into contact therewith. When the inspection of the die in contact with the probe is finished, after the wafer W is lowered and the electrode is separated from the probe 26, the electrode of the die to be inspected next time is moved to immediately under the probe 26 and is then raised and comes into contact therewith. Such an operation is repeated until the inspection of all of the dies of the wafer W is finished.

As described above, the wafer stage 18 is provided with a heater/cooling liquid path 28 and the temperature of the wafer stage 18 is forcibly changed. Therefore, it is possible to change the temperature at a comparatively high rate. When the temperature of the wafer stage 18 reaches a desired inspection temperature, the temperature control section 29 maintains the temperature during inspection. On the other hand, since no temperature adjustment mechanism is provided at each portion of, for example, the card holder 24, probe card 25, and movement mechanism, except for the wafer stage 18, there is a difference in temperature from the wafer stage 18 the temperature of which is adjusted, and the temperature gradually changes nearer the temperature of the wafer stage 18 even during inspection. This change is great in the card holder 24 and the probe card 25 near the wafer stage 18 and comparatively little in the movement mechanism.

As described above, since the temperature of the portions other than the wafer stage 18 also changes after alignment processing has been performed, the relative position between the probe 26 detected by the alignment processing and the electrode of the die of the wafer W also changes due to the thermal expansion of each portion. Because of this, if other dies not inspected yet, are moved for inspection after the inspection of part of the dies of the wafer is finished, the probe may not come into contact with the electrode properly.

If the shape of the electrode is large and the allowable range of the contact position of the probe is large, there will be no problem even if the above-mentioned relative position changes, however, as described above, the size of the electrode has become smaller and smaller in recent years, and the allowable range of the contact position of the probe has also become smaller, so the frequency of probing errors cannot be ignored.

In order to avoid such a problem, it is suggested to measure the change in the relative position between the wafer alignment camera 23 and the probe card 25, and the change in the amount of movement of the wafer stage 18 (the change in the distance between the position of the wafer alignment camera 23 and the probing position), etc., using a precision laser length measuring machine to compensate for the amount of movement. However, a laser length measuring machine is very expensive and if many machines are used, cost will be considerable.

Because of this, alignment should be carried out after the temperatures of the portions other than the wafer stage 18 become stable, allowing a sufficient standby time after the wafer stage 18 has reached a predetermined inspection temperature. However, since the temperature adjustment mechanism is not provided for portions other than the wafer stage 18, the temperatures of the other portions take some time to become stable, and throughput is reduced remarkably.

Further, it has been carried out that the alignment is performed after the wafer stage 18 has reached a predetermined inspection temperature, the inspection is then started, and a correct relative position is detected by repeating the alignment operation at short cycles. However, in order to carry out the alignment operation, it is necessary to move the wafer stage to under the alignment camera 23, and it is also necessary to perform image processing to detect the position of the electrode, and thus a certain amount of time is required, which directly leads to a reduction in throughput. In addition, the detection of the position of the probe 26 will also cause throughput to further reduce.

SUMMARY OF THE INVENTION

The present invention will solve these problems and an object thereof is to realize a prober and a probe contact method for the positional precision of probing of which has been improved without reducing throughput.

In order to realize the above-mentioned object, the prober and the probe contact method of the present invention are characterized in that the temperatures of a plurality of portions of the prober are detected and based on a prediction model that uses at least part of the detected temperatures of the plurality of portions and temperature differences between a wafer stage and other portions as a variable, the amount of change in the relative position between the electrode of a semiconductor device and the probe is calculated.

In other words, the prober of the present invention are characterized as being a prober that connects each terminal of a tester to the electrode of a semiconductor device in order to inspect the semiconductor device formed on a wafer with the tester, comprising a probe card having a probe that comes into contact with the electrode of the semiconductor device to connect the electrode to the terminal of the tester, a wafer stage that holds a wafer, a stage temperature adjustment mechanism that adjusts the temperature of the wafer stage to a predetermined temperature, a movement mechanism that moves the wafer stage, a movement control section that controls the movement mechanism, and an alignment mechanism that carries out the alignment operation to detect the position of the electrode of the semiconductor device of the wafer held by the wafer stage, as well as detecting the position of the probe of the probe card to detect the relative position between the electrode of the semiconductor device and the probe, wherein the movement control section controls the movement mechanism so that the electrode of the semiconductor device to be inspected comes into contact with the probe based on the relative position detected by the alignment mechanism, and wherein the prober further comprises a plurality of temperature sensors that detect temperatures of a plurality of portions of the prober including the wafer stage and a predicted change amount calculation section that calculates the amount of change in the relative position between the electrode of the semiconductor device, and the probe based on a prediction model that uses at least part of the detected temperatures of the plurality of portions and temperature differences between the wafer stage and other portions as a variable.

In addition, the probe contact method of the present invention is characterized by being a probe contact method in which a probe provided on a probe card of a prober comes into contact with the electrode of a semiconductor device formed on a wafer held by a wafer stage, wherein the alignment operation is carried out, in which the position of the probe of the probe card is detected and at the same time, the position of the electrode of the semiconductor device of the wafer held by the wafer stage is detected, the relative position between the electrode of the semiconductor device and the probe is detected, and based on the detected relative position, the electrode of the semiconductor device to be inspected is moved so as to come into contact with the probe, and wherein temperatures of the plurality of portions of the prober including the wafer stage are detected and based on a prediction model that uses at least part of the detected temperatures of the plurality of portions and temperature differences between the wafer stage and other portions as a variable, the amount of change in the relative position between the electrode of the semiconductor device and the probe is calculated.

If the amount of movement for probing is corrected in accordance with the calculated amount of change in relative position, it is possible to reduce the positional error of probing.

It is possible to realize detection of temperature at each portion at a comparatively low cost.

The relative position between the electrode of the semiconductor device and the probe changes depending on the difference in thermal expansion between materials constituting the prober. The level of contribution of each material to the change in relative position due to thermal expansion is complicated. However, basically, it is possible to approximate by a prediction model that uses temperatures of the wafer stage and each portion and the differences in temperature of each portion with respect to the wafer stage as a variable. Because of this, if the temperature of each part including the wafer stage is detected, the temperature differences between the wafer stage and other portions are calculated, and application is made to an approximation model, it is possible to predict the change in relative position. The model that predicts the change in relative position can be determined, for example, experimentally. Specifically, the change in temperature of each portion and the change in relative position when the temperature of the wafer stage is changed to various temperatures are detected and calculation is made by carrying out the multivariate analysis using the change in temperature of each part when the temperature of the wafer stage is changed to various temperatures as a variable.

However, in the prober, the probe card differs depending on the die formed on the wafer to be inspected and the prediction model also differs accordingly, and therefore, it is not possible to create a prediction model by taking into consideration all of the use states at the time of manufacture of the prober. Consequently, the prediction model is modified at any time by calculating the error between the amount of change in relative position actually detected under the temperature condition when the prober is actually used for inspection and by the alignment operation, and the amount of change in relative position calculated from the prediction model. Due to this, as the prober is used, the precision of the prediction model is improved.

Further, it is desirable to calculate the precision of a predicted value of the amount of change in relative position calculated based on a probability calculation model. The amount of change in relative position calculated by the prediction model is zero at the time of the alignment operation and varies as time elapses, however, precision is lowered as time elapses. In addition, as described above, accompanying the modification of the prediction model, the precision of the prediction model is improved, and in accordance with this, the precision of the amount of change in relative position calculated from the prediction model is also improved. In this manner, since the precision of the calculated predicted value changes, the error between the predicted relative position and the actual relative position changes in accordance with the precision, and the probability of an occurrence in that the probe does not come into contact with the electrode properly also changes. Because of this, the probability of an occurrence is calculated in accordance with the precision of the predicted value and when the probability is equal to or greater than a predetermined value, the alignment operation is performed in order to suppress the occurrence of an anomaly.

According to the present invention, in the case of the inspection that is conducted by changing the temperature of the wafer held by the wafer stage to a temperature different from that at the previous inspection, if the inspection is conducted immediately after the temperature of the wafer stage, that is, the wafer, has reached the inspection condition, the occurrence of an anomaly is suppressed and thus throughput can be improved.

BRIEF DESCRIPTION OF THE DRAWINGS

The features and advantages of the invention will be more clearly understood from the following description taken in conjunction with accompanying drawings in which.

DESCRIPTION OF THE PREFERRED EMBODIMENTS

Figure 1:
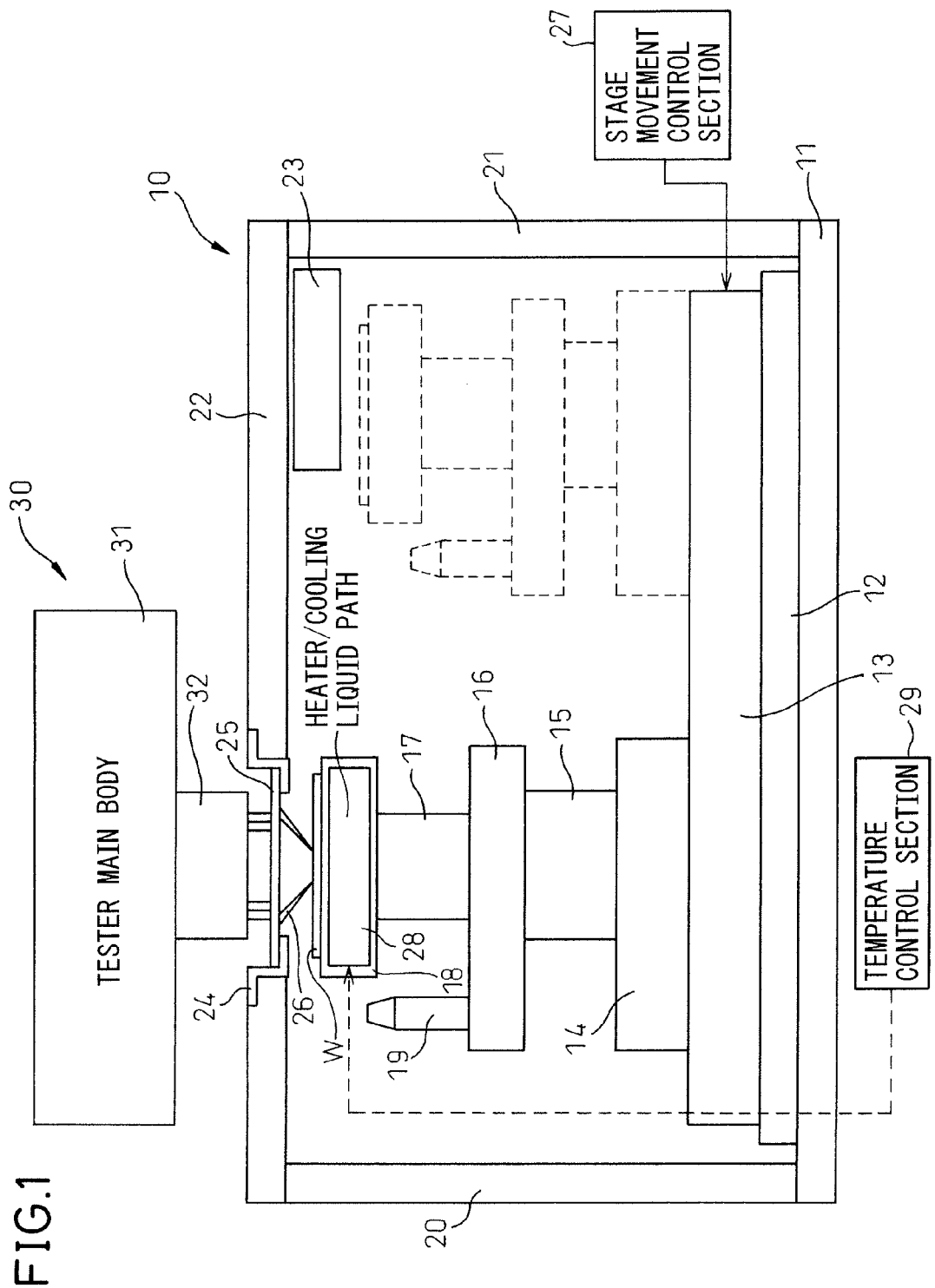
FIG. 1 is a diagram showing a basic configuration of a system that inspects a chip on a wafer with a prober and tester.
Figure 2:
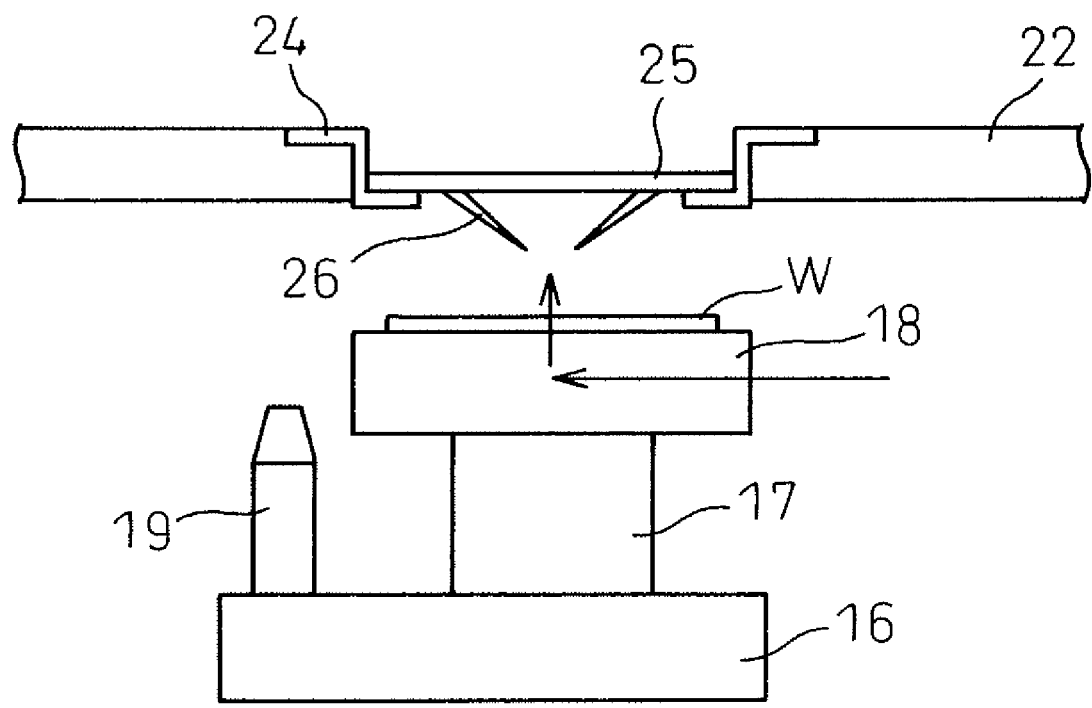
FIG. 2 is a diagram explaining the operation in which an electrode pad comes into contact with a probe.
Figure 3A:
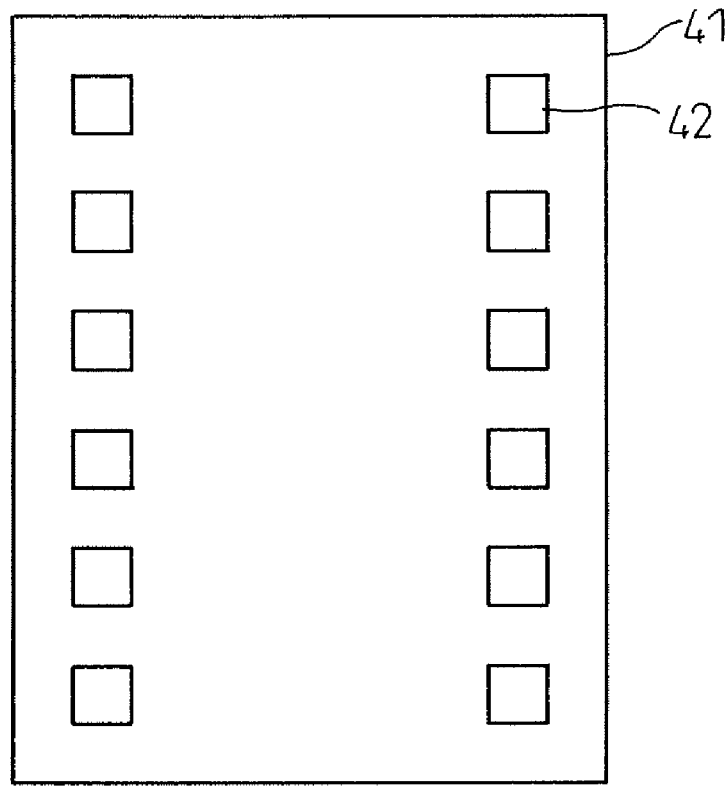
FIGS. 3A and 3B are diagrams showing an arrangement example of electrodes on a die of a wafer and an arrangement example of corresponding probes.
Figure 3B:
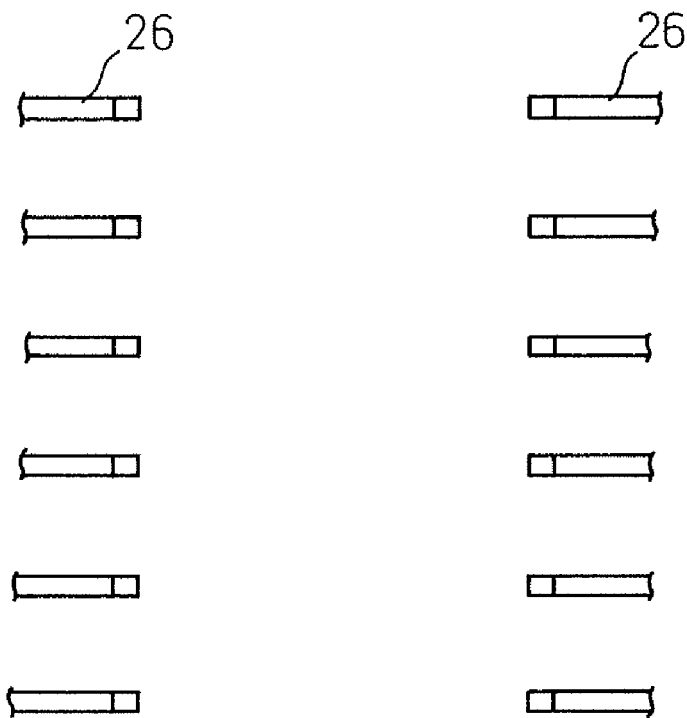
Figure 4:
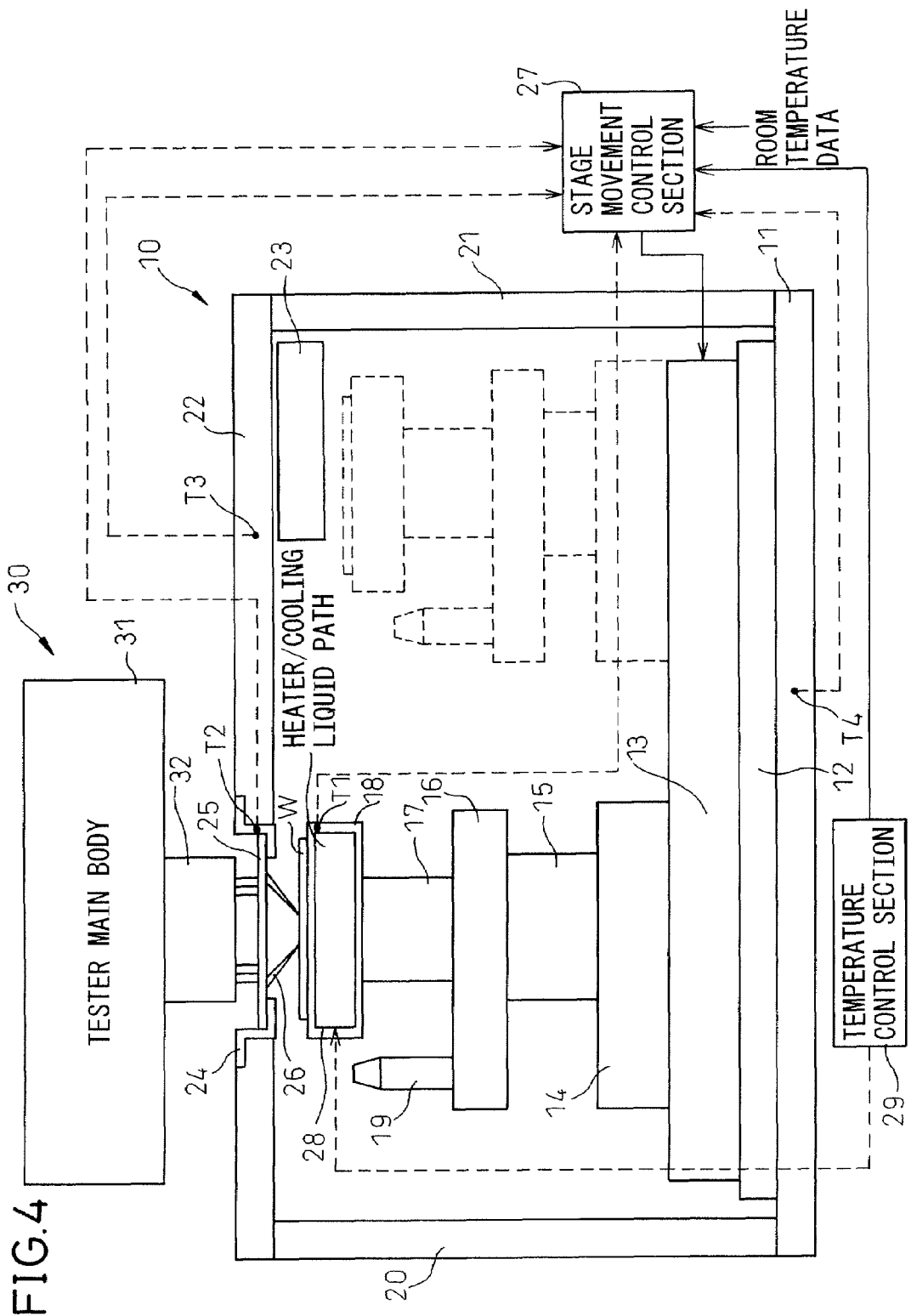
FIG. 4 is a diagram showing a basic configuration of a system that inspects a chip on a wafer with a prober and a tester in an embodiment of the present invention.

FIG. 4 is a diagram showing a general configuration of a wafer test system in an embodiment of the present invention. As obvious from the comparison with FIG. 1, the present embodiment differs from the conventional example in that a temperature sensor T1 is provided to the wafer stage 18, a temperature sensor T2 is provided to the card holder 24, a temperature sensor T3 is provided to the head stage 22, and a temperature sensor T4 is provided to the base 11, respectively. The temperature data detected by each temperature sensor is sent to the stage movement control section 27 and at the same time, temperature control information is sent from the temperature control section 29 to the stage movement control section 27, and the stage movement control section 27 calculates the change in the relative position between the probe 26 and the electrode on the die of the wafer W due to the change in temperature based on the data using a prediction model and corrects the amount of movement at the time of probing to cause the electrode to come into contact with the probe 26. Incidentally to the stage movement control section 27, data about the room temperature is also input.

Figure 5:
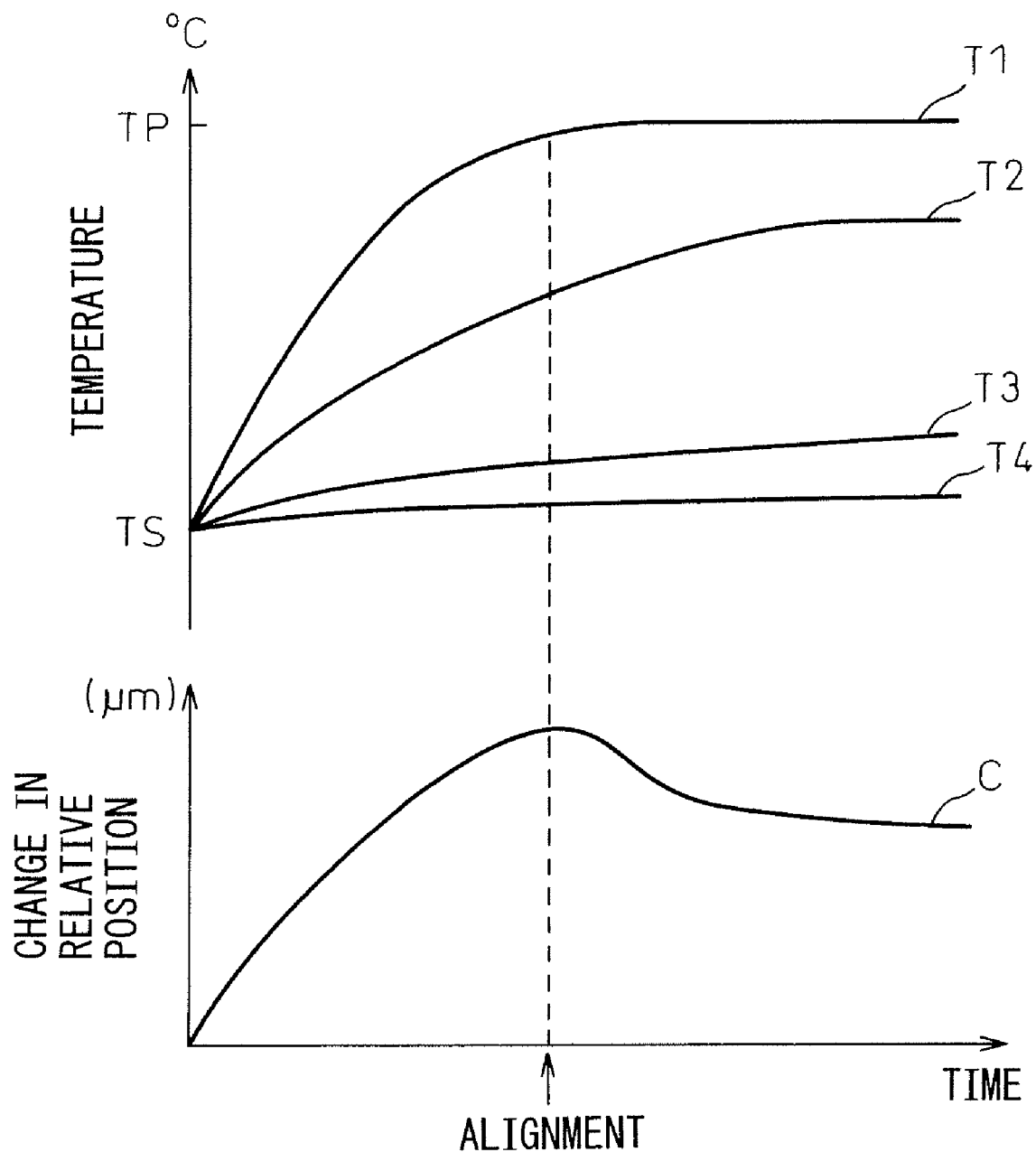
FIG. 5 is a diagram showing an example of a change in temperature of each section inside a prober and an example of a change in relative position between a probe and an electrode due to the change in temperature of a wafer stage.

FIG. 5 is a diagram showing an example of a change in the temperatures T1 to T4 and an example of a change C in the relative position between the probe 26 and the electrode of the die on the wafer W when the temperature of the wafer stage 18 is changed to TP from a state in which the temperature of the inside of the prober 10 in the state shown in FIG. 4 is kept at a temperature TS for a long time and the temperature of the wafer stage 18, the card holder 24, the head stage 22, and the base 11 is the same, that is, all of the temperature sensors T1 to T4 output data showing the temperature TS.

As shown in FIG. 5, T1 rises as the wafer stage 18 is heated and reaches the fixed value TP. An example in which temperature rises monotonically is shown here, however, there is a case where an overshooting change is carried out so that TP is reached more quickly. Since the card holder 24 is near the wafer stage 18, T2 rises to reach a temperature close to TP, however, T2 changes more gradually than T1 and becomes stable at a temperature lower than TP. In addition, T3 rises more gradually than T2 and T4 rises takes a longer time to become stable. In addition, the change C in relative position initially increases, but then decreases.

For example, in the conventional example, when T1 approached TP and entered the allowable range of the inspection temperature TP, alignment operation was carried out and inspection was started. However, after the alignment operation, the change C in relative position decreased, resulting in an error when positioning the probe 26 and the electrode.

Because of this, in the present embodiment, a predicted change amount calculation section is provided in the stage movement control section 27 and the predicted change amount calculation section periodically samples the temperature data detected by the temperature sensors T1 to T4 and calculates the predicted value of the change in relative position from the temperature of each section. The stage movement control section 27 corrects the amount of movement by the predicted value of the calculated change in relative position. The stage movement control section 27 is implemented by a computer and the predicted change amount calculation section is realized by software.

The temperatures at four portions are detected here, it may also be possible to detect temperatures at more portions, however, if the number of portions to be detected is increased, the amount of operation at the predicted change amount calculation section is increased accordingly.

The change in relative position between the probe 26 and the electrode results in thermal expansion of each section, and the temperature of each section, particularly, to the temperature difference between the wafer stage 18 and other sections. Consequently, it is possible to calculate the amount of change in relative position using a prediction model that uses the temperature of each section and the temperature difference between the wafer stage 18 and other sections as a variable.

The model that predicts the change in relative position can be determined, for example, experimentally. Specifically, the change in temperature of each section and the change in relative position are detected when the temperature of the wafer stage is changed from the various initial states to various temperatures and calculation is made by carrying out a multivariate analysis using the change in temperature of each section when the temperature of the wafer stage is changed to various temperatures as a variable. It is also possible to use a prediction model having high-order terms using the temperature of each section and the temperature difference between the wafer stage 18 and the other sections as a variable in order to increase the approximation precision.

It is desirable to determine a prediction model in the manufacture process of the prober and incorporate it in a form of software, however, the prober has a different probe card in accordance with the die formed on the wafer to be inspected and the prediction model differs accordingly, and therefore, it is not possible to create a prediction model with all of the use states being taken into consideration at the time of manufacture of the prober. Because of this, when the prober is manufactured, a standard prediction model using a standard probe card is created and if another different probe card is used in the actual prober, an error between the amount of change in relative position actually detected under the temperature condition when the prober is actually used for inspection and by the alignment operation and the amount of change in relative position calculated from the prediction model is calculated based on the standard prediction model to modify the standard prediction model appropriately and thus, a prediction model adapted to the individual conditions such as the probe case to be used is created. Due to this, as the prober is used, the precision of the prediction model is improved.

The amount of change in relative position calculated by the prediction model is zero at the time of the alignment operation and varies as time elapses, however, its precision is lowered as time elapses. Due to this, the error between the predicted relative position and the actual relative position increases and the probability of occurrence of probing anomaly that the probe does not come into contact with the electrode normally increases. In addition, when the precision of the prediction model is improved accompanying the modification of the prediction model, the precision of the amount of change in relative position calculated using the prediction model in accordance with this is also improved. Due to this, the error between the predicted relative position and the actual relative position is reduced and the probability of occurrence of probing anomaly is reduced.

Because of this, in the present embodiment, the probability of an anomaly is calculated based on the probability calculation model that uses the elapsed time from alignment as a variable. This probability calculation model is modified appropriately if the precision of the prediction model is improved accompanying the modification of the prediction model as described above so that the probability of an occurrence of a probing anomaly is reduced. In addition, when a new probe card that has never been used before is used, the probability calculation model is modified so that the probability of an occurrence of a probing anomaly is increased.

The stage movement control section 27 suppresses the occurrence of an anomaly by carrying out an alignment operation when the calculated probability is equal to or greater than a predetermined value.

Figure 6:
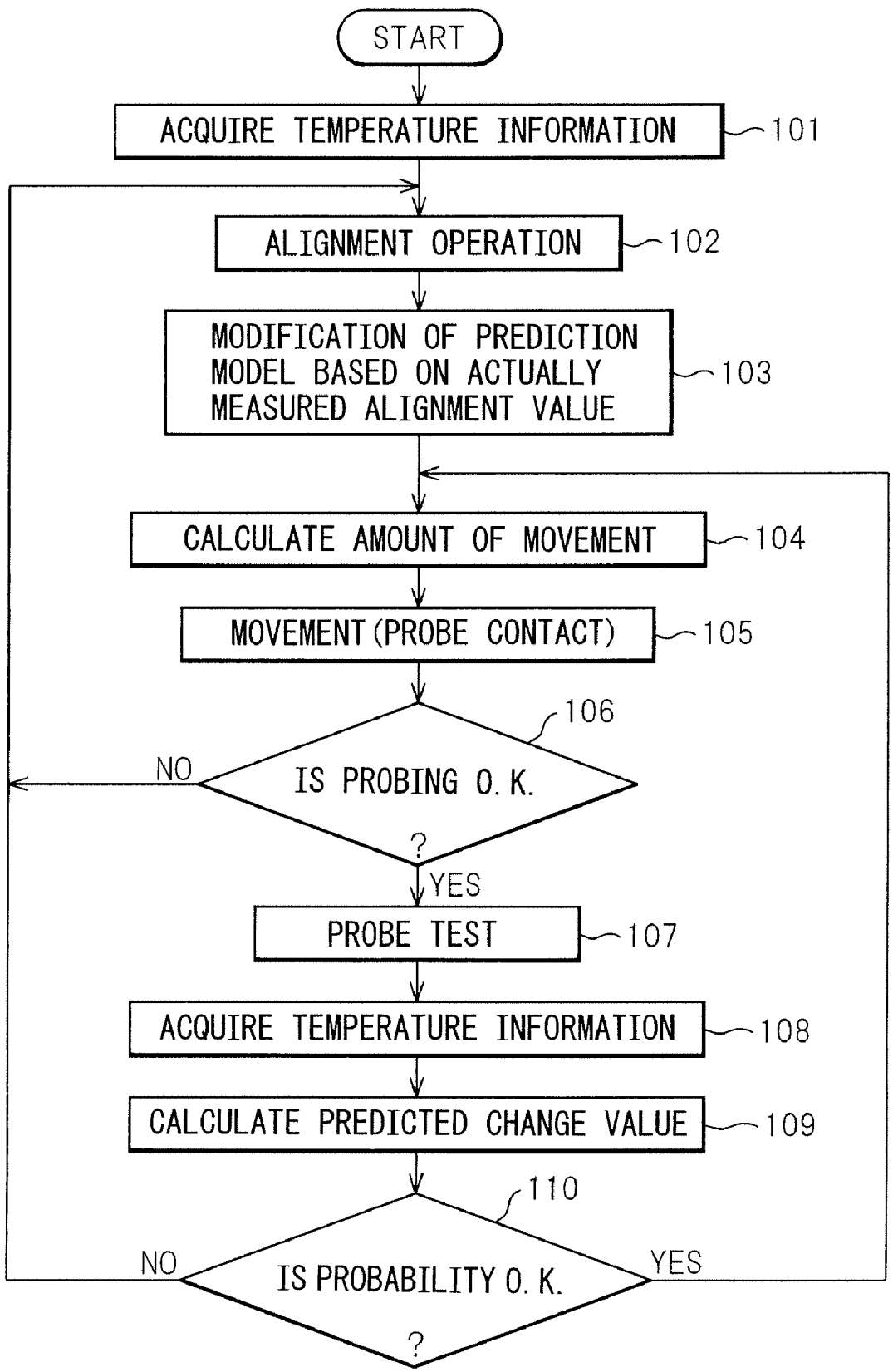
FIG. 6 is a flow chart explaining the modification processing of a prediction model in an embodiment.

FIG. 6 is a flow chart explaining the modification processing of the above prediction model. This flow chart shows the processing that is modified appropriately when a new probe card is mounted and the standard prediction model is used.

The temperature of the wafer stage 18 is controlled so that the inspection temperature is reached by the same method as the conventional method and when T1 reaches a predetermined temperature (allowable range of the inspection temperature), temperature information is acquired in step 101. This temperature information is the inspection temperature data and temperature data of each section.

In step S102, the alignment operation is carried out and the relative position of the die with respect to the probe 26 is calculated.

In step S103, the predicted value of the change in relative position is calculated in accordance with the prediction model and it is compared with the actual value of the change in relative position by the alignment operation carried out in step S102. Then, the prediction model is modified so that a predicted value the difference of which from the actual value is small can be obtained. In the first step, the standard prediction model is used as a new prediction model and at the second or later time the prediction model used at that point of time is used. In addition, the actual value of the change in relative position by the alignment operation is employed as a predicted value. In other words, the error of the predicted value is zero.

In step 104, the amount of movement is calculated and the amount of movement is determined by correcting the calculated amount of movement based on the predicted value.

In step 105, movement is made such that the electrode on the die to be inspected next comes into contact with the probe 26 based on the amount of movement determined in step S104.

In step 106, whether the contact of the electrode with the probe 26 is normal by the signal from the tester or when it is in a normal contact state, the process advances to step 107 and when it is not normal, the process returns to step 102 and the above-mentioned processing is carried out again.

In step 107, power and a test signal are input from the tester to the electrode of the die and an electrical inspection (probe test) for the normal operation by receiving the output signal of the die from the electrode.

In step 108, after the probe test is completed, temperature information is acquired and in step 109, the predicted value of the change in relative position is calculated based on the prediction model. Then, the calculation precision of the predicted value and the probability of occurrence of probing anomaly described above are calculated, the probability of occurrence of probing anomaly is calculated, and whether the probability of an occurrence of a probing anomaly is problematic, that is, whether the probability is equal to or less than a predetermined value is determined in step 110. When the probability is equal to or less than a predetermined value, the probing problem is unlikely to occur, and therefore, the process is returned to step 104 and the next probing is carried out without the alignment operation. When probability is equal to or greater than a predetermined value, the probability that a probing problem will occur is high, and therefore, the process is returned to step 102 and alignment operation is carried out.

After that, the above-mentioned operation is repeated. The repetition is continued until the wafer is changed to another and when the probe card is exchanged with another, if there is a probe card to be used next time, it is used and modification is further continued. As described above, since the prediction model is improved sequentially and the precision of the predicted value is improved, the number of times of execution of alignment operation is reduced gradually and throughput is further improved.

The present invention can be applied to any prober as long as its temperature can be adjusted.

We claim:

1. A prober for connecting each terminal of a tester to an electrode of a semiconductor device in order to inspect the semiconductor device formed on a wafer with the tester, the prober comprising:
    a probe card having a probe for connecting the electrode to the terminal of the tester by coming into contact with the electrode of the semiconductor device;
    a wafer stage for holding a wafer;
    a stage temperature adjustment mechanism for adjusting the temperature of the wafer stage to a predetermined temperature;
    a movement mechanism for moving the wafer stage;
    a movement control section for controlling the movement mechanism; and
    an alignment mechanism for carrying out an alignment operation to detect the position of the electrode of the semiconductor device of the wafer held by the wafer stage as well as detecting the position of the probe of the probe card to detect the relative position between the electrode of the semiconductor device and the probe, wherein; the movement control section controls the movement mechanism so that the electrode of the semiconductor device to be inspected is caused to come into contact with the probe based on the relative position detected by the alignment mechanism; and wherein the prober further comprises: a plurality of temperature sensors for detecting the temperatures of a plurality of portions of the prober including the wafer stage; and a predicted change amount calculation section for calculating the amount of change in relative position between the electrode of the semiconductor device and the probe based on a prediction model that uses at least part of the detected temperatures of the plurality of portions and the temperature difference between the wafer stage and the other sections as a variable.

2. The prober as set forth in claim 1, wherein
the movement control section corrects the amount of movement in accordance with the amount of change in relative position calculated by the predicted change amount calculation section.

3. The prober as set forth in claim 1, wherein
the predicted change amount calculation section calculates, when the alignment mechanism detects the relative position, the error between the amount of change in relative position detected by the alignment mechanism and the relative position calculated by the predicted change amount calculation section to modify the prediction model.

4. A probe contact method that makes a probe provided on a probe card of a prober come into contact with an electrode of a semiconductor device formed on a wafer held by a wafer stage, the method comprising:
    carrying out an alignment operation to detect the position of the electrode of the semiconductor device of the wafer held by the wafer stage, as well as detecting the position of the probe of the probe card to detect the relative position between the electrode of the semiconductor device and the probe; and
    moving the electrode of the semiconductor device to be inspected so as to come into contact with the probe based on the detected relative position, wherein
the method further comprises:
    detecting the temperatures of a plurality of portions of the prober including the wafer stage; and
    calculating the amount of change in relative position between the electrode of the semiconductor device and the probe based on a prediction model that uses at least part of the detected temperatures of the plurality of portions and the temperature difference between the wafer stage and the other sections as a variable.

5. The probe contact method as set forth in claim 4, wherein the amount of movement when the electrode of the semiconductor device comes into contact with the probe is corrected by the calculated amount of change in relative position.

6. The probe contact method as set forth in claim 4, wherein when the alignment operation is carried out, the prediction model is modified by calculating the error between the detected actual amount of change in relative position and the calculated amount of change in relative position.

* * * * *